United States Patent

Langdon

[15] 3,656,028

[45] Apr. 11, 1972

[54] CONSTRUCTION OF MONOLITHIC CHIP AND METHOD OF DISTRIBUTING POWER THEREIN FOR INDIVIDUAL ELECTRONIC DEVICES CONSTRUCTED THEREON

[72] Inventor: Jack L. Langdon, Wappingers Falls, N.Y.

[73] Assignee: International Business Machines Corporation, Armonk, N.Y.

[22] Filed: May 12, 1969

[21] Appl. No.: 823,662

[52] U.S. Cl. ..........................317/235 R, 148/175, 307/303, 317/235 P

[51] Int. Cl. ..........................H01l 19/00

[58] Field of Search ..........................317/235

[56] References Cited

UNITED STATES PATENTS

| | | | |
|---|---|---|---|
| 3,423,650 | 1/1969 | Cohen | 317/235 |
| 3,460,010 | 8/1969 | Domenico et al | 317/235 |
| 3,372,070 | 3/1968 | Zuk | 317/235 |
| 3,538,397 | 11/1970 | Davis | 317/235 |

OTHER PUBLICATIONS

IBM Tech. Discl. Bul., " Semiconductor Device with Vertical Resistor" by Geller, Vol. 11, No. 11, page 1390 April 1969

*Primary Examiner*—Jerry D. Craig
*Attorney*—Hanifin and Jancin and George O. Saile

[57] ABSTRACT

To eliminate parasitic voltage drops to electrodes of semiconductor devices built on a semiconductor chip or wafer, due to the use of an element of a voltage and current supply conductor in common for several such semiconductor devices, a separate path is diffused for each electrode, onto such chip or wafer as a built-up post of the basic semiconductor material of the chip or wafer, and the back surface of the chip or wafer is used as a relatively wide area surface as a voltage supply bus, which may also be connected to a metal base for the double purpose of establishing that surface at some selected known potential and providing a good heat sink for the chip or wafer. Generally, the potential of the metal base may be placed at ground, but need not be.

7 Claims, 12 Drawing Figures

INVENTOR
JACK L. LANGDON

BY George O. Saile
ATTORNEY

CONSTRUCTION OF MONOLITHIC CHIP AND METHOD OF DISTRIBUTING POWER THEREIN FOR INDIVIDUAL ELECTRONIC DEVICES CONSTRUCTED THEREON

RELATED APPLICATIONS

Patent application Ser. No. 697,732, filed Jan. 15, 1968, entitled "Power Connections in Integrated Circuit Chip," inventor Fred A. Reid.

Patent application Ser. No. 697,731, now U.S. Pat. No. 3,560,277 filed Jan. 15, 1968, entitled "Process for Making Semiconductor Bodies Having Power Connections Internal Thereto," inventors Robert H. F. Lloyd, Stanley P. Davis and C. Frank Meyers.

BACKGROUND OF THE INVENTION

1. Field of the Invention

This invention relates to monolithic semiconductor chips constructed as integrated circuits, and constructed to prevent and eliminate certain parasitic voltage drops which detrimentally affect the operation of certain devices, such as transistors, when constructed on a chip and which are voltage sensitive and require normal, full operating voltage as designed, in order to provide optimum operation in the related circuitry.

With such evolution of the transistor to small incremental areas or volumes, a collection or integration multiple circuits became possible on relatively small wafers or chips of semiconductor material. However, such advance in the development of integrated circuitry, on an individual small wafer or chip, has brought problems.

2. Description of Prior Art

In macro systems, line conductors that are used to serve as voltage busses are sufficiently large to carry substantial currents, and have a relatively low resistivity, sufficient to be able to carry such currents with minor voltage drops in the bus conductors. Where such bus conductor is used to supply voltage and current to several electronic devices, which in the prior art were triodes or the like, with their connecting load resistors, that could make substantial current demands on the bus conductors.

In the micro systems of integrated circuitry, however, as constructed on the small wafers and chips, bus conductors are relatively small, of small cross-section, and, even though having a small resistivity parameter, do nevertheless have a relatively high resistance along the length of such bus conductors. Consequently, when such small, microsized bus conductors are employed to carry even small currents to the electrodes of certain devices such as transistors, as in present conventional practice, such relatively high resistance value of the microsize bus conductor can introduce a detrimental voltage drop effect along such bus conductor in the operation of certain devices, such as transistors, with the result that a full voltage may not be achievable and available at a point in the circuit where such full voltage is necessary to operate a device in the system.

Upon analysis of the difficulty that arises in the operation of such an integrated circuit on a small wafer, it is realized that such difficulty arises from the mutual utilization of a small voltage supply conductor for supplying a voltage connection to each of the corresponding electrodes of several transistors employed in the cooperative system, with the result that the currents to the several transistors traverse a common portion of the supply conductor and thereby introduce a reduction in the voltage supplied to a device supplied beyond that common portion of supply conductor.

Because of the small dimensional parameters of these small wafers or chips that are used as integrated circuits, there is a space difficulty in providing necessary connections from an external voltage supply source to the electrode areas that are to serve as terminals for semiconductor devices such as transistors that are formed in and on the wafer or chip.

SUMMARY OF THE INVENTION

To overcome those prior art disadvantages and problems of space difficulties and voltage drops, this invention utilizes the inherent internal construction of the chip, as manufactured, to provide an electrical conducting path through the body of the chip, to each surface area which will constitute a terminal area, or land, for an electronic device, such as a transistor or a diode, that is formed on the body and on the surface of the wafer or chip in manufacture, to constitute part of the integrated circuit formed in and on the wafer or chip. The electrical conducting path is formed during manufacture, of the same basic semiconductor material of which the chip is made, or is built on a wafer as a substrate in order to start with a semiconductor material of a desired type. The individual paths, for conducting the voltage from the substrate to any desired area of the ultimate chip, are then built in the semiconductor material of the appropriate conductivity type during the formation of the device structure. Individual columns or paths of the basic type semiconductor material extend from the one side of the wafer to the other surface of the wafer to connect the back surface of the wafer with the metallization on the other surface of the wafer.

By constructing such electrically isolated individual paths within the wafer, a direct conducting path is provided from a bottom layer of basic type material of the wafer to each of preselected areas at the top surface of the wafer. Each of those conducting paths upward through the body of the wafer thus provides direct electrical connection to the bottom surface or bottom layer of the wafer, which is of the basic type of semiconductor material selected for the voltage polarity desired for that service. Each such conducting path thus serves two purposes, first, to supply the voltage needed for the corresponding terminal of the semiconductor device at the land or area at the top surface of the wafer, and, second, to provide a certain amount of resistance in such path, from the bottom surface of the wafer to the terminal land on the top surface, which will constitute an available electrode terminal point for the corresponding electrode of the semiconductor device for which that top land or area of the wafer is to be utilized. The bottom surface of the wafer in this connection then serves as a substantially large area bus bar, to which an external voltage may be applied, to provide a source of operating voltage to the integrated circuit.

The invention is particularly applicable to the current switch emitter follower logic circuits such as described in the H. S. Yourke, U.S. Pat. No. 2,964,652 and assigned the same assignee of the present invention. This type of circuit is particularly sensitive to voltage losses due to IR drop through the power bus parasitic resistance phenomenon.

An object of the invention is to provide the superior distribution of power in an integrated circuit and to save space that would otherwise be required on the top surface of the wafer for voltage supply conductors.

A further object of the invention is that the inherent resistance in each individual path is utilized as part of a supply voltage resistor, such as, for example, the resistor that is connected to a selected electrode terminal of a transistor or the like, operatively selected at the top of the wafer.

A still further object of the invention is to provide a construction and arrangement of circuitry in and on a wafer, that will permit the back surface of the wafer to be utilized both for cooling and for grounding the circuitry of the finished wafer, while permitting the cooled and grounded surface to be utilized as a uni-potential surface for the various semiconductor devices built in and on the wafer.

The foregoing and other objects, features and advantages of the invention will be apparent from the following more particular description of the preferred embodiments of the invention, as illustrated in the accompanying drawings.

DESCRIPTION OF THE DRAWINGS

In these, FIG. 8A shows an N+ substrate;

FIG. 8B represents the same substrate with N regions formed therein;

FIG. 8C is a further illustration of the P− epitaxial growth upon the top surface of the substrate; and FIG. 8D illustrates the formation of the resulting semiconductor structure.

DESCRIPTION OF THE PREFERRED EMBODIMENTS

Figure 1:
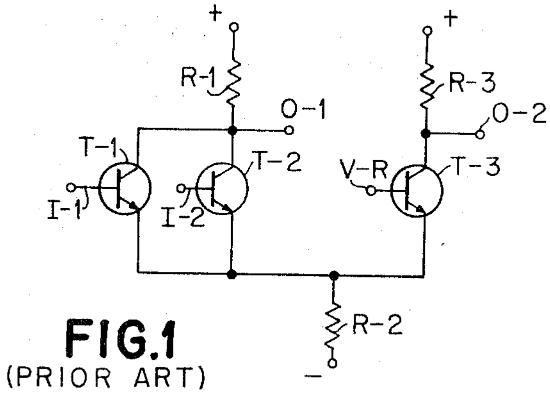
FIG.1 (PRIOR ART)
FIG. 1 is a standard switching circuit of the prior art to illustrate an arrangement in which two switching transistors are arranged to be alternately and singly operative, with each transistor shown provided with its own voltage supply resistor.

FIG. 1 illustrates a conventional circuit arrangement which utilizes transistors for circuit switching purposes, and is illustrated herein merely to show how such a switching arrangement with ordinary circuitry is provided with its own voltage supply resistor for the input power electrode to each of the operating switching transistors, in this case shown as the collector electrode.

The arrangement shown in FIG. 1 is merely by way of example, and includes three transistors, T–1, T–2 and T–3. Transistors T–1 and T–2 are shown connected in parallel, at their respective collector and emitter terminals, and are provided with a common voltage supply resistor R–1 and a common cathode or emitter resistor R–2. The base terminal of the transistor T–1 is identified as I–1 to indicate that it is one input terminal. The corresponding base terminal of transistor T–2 serves as a second input terminal and is identified as I–2. The common collector terminal for both transistors T–1 and T–2 serves as the output terminal O–1. In similar fashion the transistor T–3 receives positive voltage through a voltage supply resistor R–3 at its collector electrode which serves as output terminal O–2, and the emitter electrode of T–3 is connected to the common resistor R–2 to the negative voltage of the circuit. Merely for illustrative purposes, the voltage on the base terminal of transistor T–3 is identified as a reference voltage V–R.

Figure 1A:
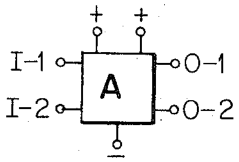
FIG.1A (PRIOR ART)
FIG. 1A is a single block with the inputs and outputs indicated to provide a simple representative showing of a circuit such as shown in FIG. 1.
Figure 2:
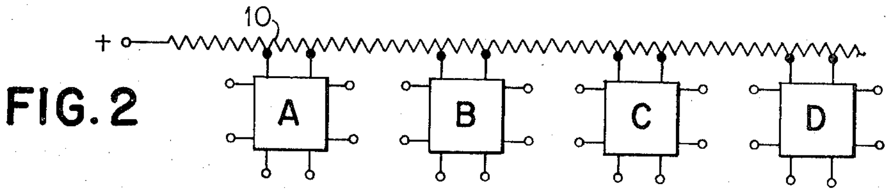
FIG. 2 is a typical conventional circuit of the prior art which has been utilized heretofore in an integrated circuit on a single wafer, and illustrates how the mutual circuit paths in a single voltage conductor bus, to supply operating voltage to several switching circuits of the type shown in FIGS. 1 and 1A, will introduce undesirable voltage drops to the several switching arrangements illustrated in FIG. 2, because of the parasitic resistance effects in those portions of the path along the voltage bus conductor that serve as mutual paths for the currents to the various switching arrangements.

The small box in FIG. 1A represents the circuit in FIG. 1 and serves to provide a symbol for that circuit for use in the simplified diagram in FIG. 2.

As shown in FIG. 2, four switching arrangements identified as A, B, C and D, respectively, are shown as provided with operating potentials for the individual circuit terminals, from a power bus circuit 10 having its front end connected to a positive terminal and extending backward to provide connection points for the respective circuit voltage terminals at the top of each of the switching assemblies A, B, C and D. The circuit in FIG. 2 represents the circuitry used prior to this invention, and illustrates the manner in which the parasitic resistance in the bus conductor 10 detrimentally affects the operation of all the arrangements in the entire circuit of FIG. 2, by reducing the voltage available to each circuit terminal that is connected to the positive bus 10. If any one of the switching arrangements A, B, C or D is drawing current, the bus conductor 10 serves as a mutual resistor in which that flowing current will cause a voltage drop. The result is that the voltage available to any other of the operating switching units is reduced by the amount of that parasitic voltage drop.

Consequently, the loss of voltage in the bus conductor 10 due to the mutual use of any part of the bus conductor 10 by any one of the switching units causes a corresponding loss in voltage at the supply electrode terminals of the others of the switching assemblies A, B, C or D. As a result, when any one of the transistors is not energized to be operative, and its output voltage should be "up," such output voltage cannot reach its full intended design "up" value, and the components connected in the circuits to be energized from the output terminal of that transistor therefore do not receive the full voltage for which they are designed to operate, and the system operation may suffer.

Figure 3:
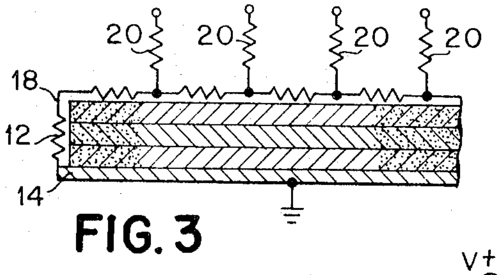
FIG. 3 is a schematic illustration of the FIG. 2 circuit in a semiconductor chip or wafer wherein the top surface bus is energized by some single voltage path from the back surface of the chip to the entire bus conductor on the top surface of the wafer.

FIG. 3 shows a variant in the arrangement for providing a voltage conducting path from the back surface of a wafer 14 to an upper level of distribution on a fabricated circuit built on a substrate. The back surface of the chip 14 is connected to ground, and is also used as a terminal for the positive potential of the voltage to be applied to the semiconductor devices, so that all operating voltages are otherwise below a schematically indicated potential, here shown illustratively as a ground. The conducting path 12 may consist of the bulk material corresponding to the type of semiconductor material constituting the substrate 14, and proceeds to the surface layer 18 of a metal which serves as a voltage bus conductor, corresponding, for example, to the bus conductor 10 in FIG. 2, a typical resistivity of conductor 18 being in about the range of 40 to 100 milliohms per square for metals, such as aluminum. Individual electrode terminal resistors 20 are schematically indicated, whose inner terminals, shown unconnected, will be connected to the appropriate lands or areas available at that level of distribution of the finished integrated circuit unit, and their outer terminals are shown appropriately connected to the voltage supply bus conductor 18. Under these conditions, of course, the same difficulties explained in connection with the circuitry as shown in FIG. 2 will also be present in the arrangement shown in FIG. 3.

Figure 4:
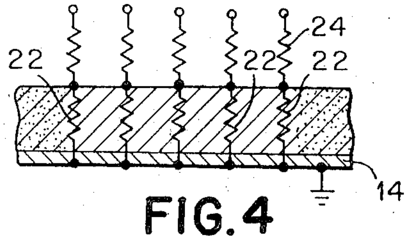
FIG. 4 is a schematic illustration of the arrangement whereby the present invention is applied to a unit chip or wafer to provide separate individual diffused paths through the thickness and depth of the wafer, with each path terminating at a land or area on the top surface of the wafer which serves as a terminal connecting land or point for an additional resistor of appropriate value, to be added to and compensate for the inherent resistance of each path through the thickness of the wafer.

In order to avoid that difficulty of parasitic voltage drop, as in the prior art, due to mutual usage of a common conducting path to the voltage supply electrodes of several semiconductor devices, the general principle of this invention is to provide, as shown in FIG. 4, separate individual paths 22, provided by a technique such as diffusion or ion implantation, that extend upward from the back surface of the substrate 14 through any superposed layers of insulation and semiconductor material to terminal lands or areas at the top level of the ultimate fabricated integrated circuit. There those lands are then available for connection as voltage supply points to the circuitry. Thus, those lands serve for receiving connections to resistors 24 which may be formed within the semiconductor chip. Their values may be such as to compensate for, whenever necessary, the resistance values of those separate diffused paths as terminal voltage supply conductors.

Figure 5:
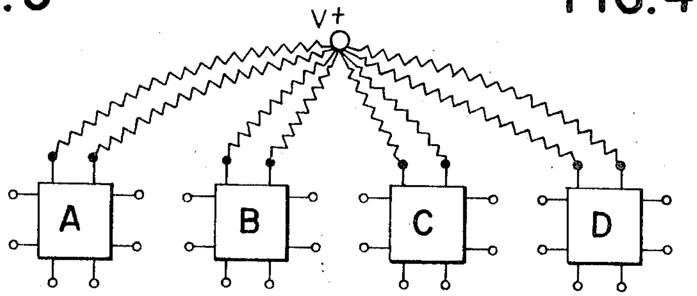
FIG. 5 is a schematic diagram illustrating how individual voltage conducting paths to the input voltage terminal lands of the respective switching arrangements are provided, as represented by individual input voltage resistors that are separately connected to a voltage supply bus disposed as the back surface of the wafer to avoid any parasitic voltage drops due to mutual current paths in the voltage supply lines.

Upon completion of the circuitry, involving, for example, several switching assemblies A, B, C and D, such as shown in FIG. 2, in accordance with the voltage supply principle of the invention as shown in FIG. 4, the completed circuit arrangement then corresponds to the circuitry as shown in FIG. 5, where each of the input voltage electrodes of the several switching assemblies A, B, C and D, are connected directly to the voltage source V+, free of any mutual resistance paths. Thus, there are no parasitic voltage drops due to the current in one switching device causing a reduced voltage to be applied to one of the other switching devices. This characteristic is of great value where the integrated circuit logic circuitry used is current switch emitter follower.

Figure 6:
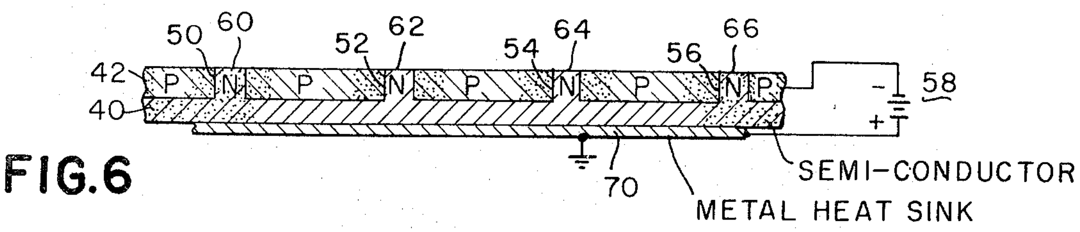
FIG. 6 is a front vertical sectional view taken through a path, such as the section 6-6 of FIG. 7, of a wafer prepared in accordance with this invention.

In FIG. 6, is shown a sectional view of a form of basic structure for an integrated circuit constructed on a semiconductor wafer as a substrate of a selected impurity type. There, the invention is shown as initially applied by superimposing semiconductor material of both impurity types in respectively controlled layers and areas to make terminal areas or lands available at selected areas of the top level surface of the structure. Thus, the voltage available and impressed on the bottom surface layer of the wafer may be brought up to other levels of the integrated circuit structure, so it will also be available at the top surface level, for use as a voltage supply source for the same or for an associated element of an electronic device, at the top surface of the fabricated structure, where that element is to serve as an element of a semiconductor device.

An example of the respective impurity types of the semiconductor materials in the substrate and in any of the superimposed epitaxial layers of one type are indicated in FIG. 6 by the letter P or N. The impurity types may, of course, be fully reversed or altered in other ways as is understood by those skilled in the art.

Figure 7:
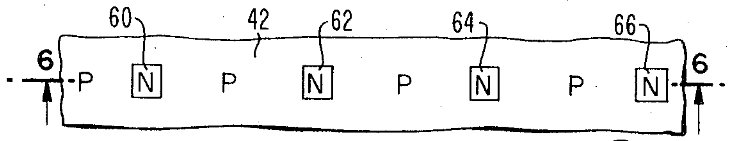
FIG. 7 is a plan view of a portion of the wafer of the form shown in section by FIG. 6, to show adjacent related surface areas or lands of the diffused paths at a first level of the devices to be constructed on the wafer.

FIG. 7, as a plan view, is merely to show the plan view of FIG. 6 top surface of the structure, without any passivation layer.

In FIGS. 8A to 8D are shown one preferred method for manufacturing the structure of the present invention. The details of the example are included merely to aid in the understanding of the invention, and variations may be made by one skilled in the art without departing from the spirit and scope of the invention.

Figure 8A:
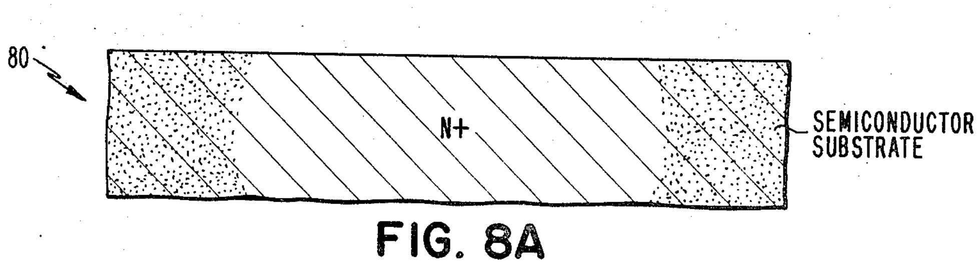
FIGS. 8A to 8D illustrate the successive method steps of a preferred embodiment to form the semiconductor structure of the present invention.

In FIG. 8A, an enlarged side view of a portion of a substrate 80 is shown, of semiconductor material, indicated to be doped with a donor impurity, such as arsenic, phosphorus or antimony corresponding to the N of FIG. 6.

By way of example, the substrate material in FIG. 8A may start as a silicon wafer, with a diameter 1.25 inches, and chemically and mechanically polished to planarity, to a thickness of 7.1 to 8.7 mils, one suitable and effective method for accomplishing that being disclosed in Joseph Regh, et al., U.S. Pat No. 3,436,259, entitled "Method for Plating and Polishing a Silicon Planar Surface," and assigned to the assignee of this application. The substrate 80 is of, for example, <100> orientation with standard notch and flat for assuring parallelism in subsequent sequential operations. The substrate may be arsenic doped to a concentration to establish a resistivity in the range of 0.0078 to 0.0113 ohm cm.

The substrate, which is normally a wafer of monocrystalline semiconductor material of the dimension specified above, will generally be used for the formation of fifty or more separate complete electron blocks, or dice, all of which are simultaneously treated and formed until completion of each as an integrated circuit, after which they are then separated from the wafer and from each other by conventional techniques.

Figure 8B:
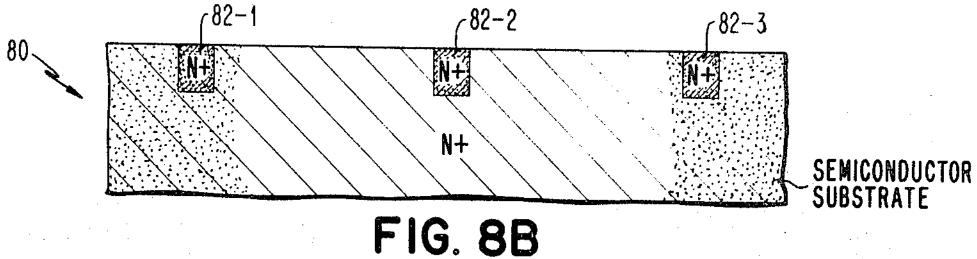

In FIG. 8B, the wafer 80 is shown after treatment to establish, as an illustration, three diffused channels 82, to constitute and serve as parts of diffused voltage paths or channels from the substrate 80 to the top of the final fabricated block.

The steps to form those three zones 82, include, first, an initial thermal oxidation of the wafer 80 by heating for thirty to forty minutes in an oxidizing atmosphere at a temperature of about 970° C., to form a silicon oxide film layer of about 5,000 angstroms; second, the formation of a photoresist masking by conventional techniques to protect the surface for the subsequent operation; third, subjecting the wafer to an etching solution, effective at and through prelocated areas of the photoresist to open channel windows through the silicon dioxide layer and to the surface of the substrate material; fourth, subjecting the wafer to a new atmosphere of donor impurities, here, for example, $POCl_3$, at a temperature of 970° C., for twenty to thirty minutes, for diffusion of the impurity into the wafer at those windows. For this fourth step, the atmosphere should present at a density that will produce a wafer surface concentration of $3.5 \times 10^{20}$ atoms per cubic centimeter.

At this stage, the wafer is stripped by conventional etching of all oxide surface films, and will be in the condition indicated in FIG. 8B, down to the original surface level of the wafer, with the three channels 82–1, 82–2, and 82–3 doped to a low resistivity.

Figure 8C:
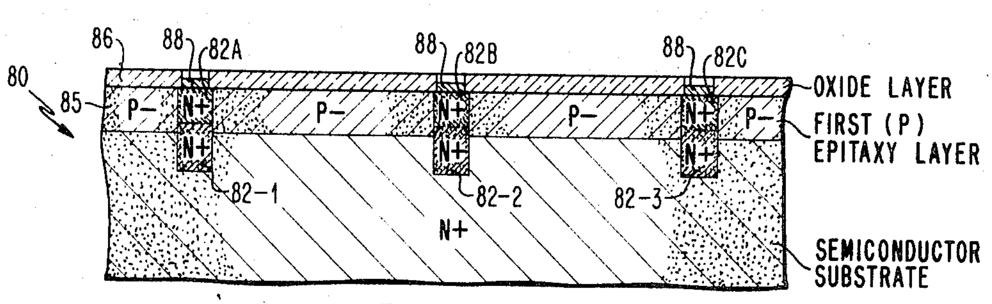

The next operation is now performed to bring the device wafer to the condition in FIG. 8C.

This next operation starts with the deposition of an expitaxial layer 85 over the entire surface of the wafer 80, taken as in FIG. 8B, of intrinsic material with P impurity, to a thickness of $6.1 \pm 0.3$ microns, to establish a resistivity greater than 15 ohm cm, at a temperature of 1,150° C. The growth rate may be 0.5 microns per minute in a horizontal reactor, to 0.7 microns per minute in a vertical barrel reactor such as shown in E. O. Ernst et al. U.S. Pat. No. 3,424,629. The N+ regions out diffuse to some extent into the epitaxial layer 85 as it grows.

The first post epitaxial oxidation is now performed for 30 to 40 minutes at 970° C. to a thickness of about 4,600 Angstroms to produce layer 86. As before, a photoresist masking layer is formed, and etched to open channel windows in the silicon dioxide layer over the areas to be diffused, directly above areas 82–1, 82–2 and 82–3. The remaining areas and the back of the wafer remain covered and protected by the silicon dioxide layer just formed.

The wafer is now again exposed to the diffusion atmosphere of $POCl_3$ for twenty to thirty minutes at 970° C. for the phosphorus diffusion, with subsequent drive-in heating for twenty to thirty minutes at 1,050° C., during which time a thin oxide film 88 is formed to about 4,000 angstroms. The impurity concentration at the surface, should reduce down to about $8 \times 10^{20}$ at the surface after drive-in.

The channels 82–1, 82–2 and 82–3, in the substrate now extend upward through channel extensions 82A, 82B and 82C to the top surface of the epitaxial layer 85 and of the oxide layer 86, 88.

The oxide layer on the surface of the wafer is removed to bring the wafer down to the top surface of epitaxial layer 85 of P impurity type, as in FIG. 8C.

A second epitaxial layer 90 is formed on layer 85, with N type impurity. Oxidation is performed as in the first epitaxial oxidation, with subsequent application of a photoresist mask, for channel reach-through diffusion, with appropriate N type impurity diffusion 92A, 92B, 92C to extend the channels 82A, 82B, and 82C upward, and with selectively located P+ type diffusion to isolate the N channels. For these diffusions, the same phosphorus diffusion may be used as before for N regions, while a boron diffusion may be used for the P+ isolation diffusions.

Figure 8D:
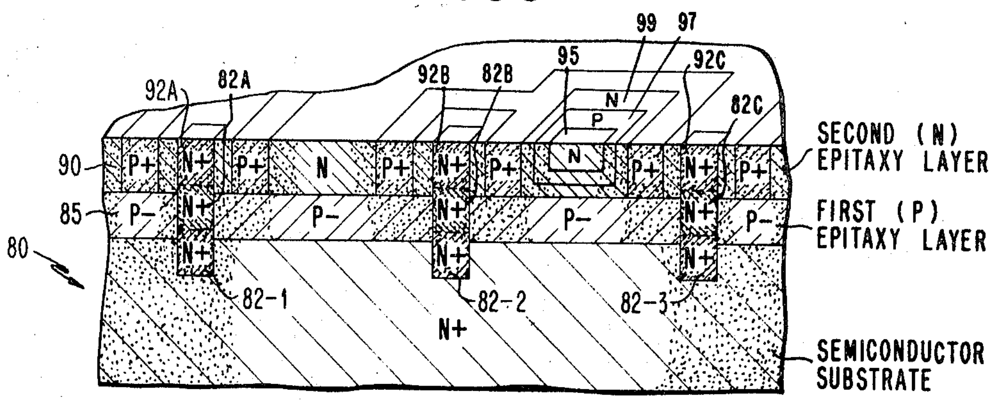

A wafer is now available to form monolithic semiconductor circuits or devices, such as a transistor illustrated in FIG. 8D which includes emitter 95, base 97 and collector 99, which may be done by way of example, as disclosed in co-pending application of I. Feinberg et al., filed May 23, 1967, Ser. No. 640,610, now U.S. Pat. No. 3,539,876 entitled "Monolithic Integrated Structure Including Fabrication Thereof," and assigned to the same assignee of this application. The N channels or posts must, of course, be connected to the top surface by utilizing the N epitaxial layer, a subcollector diffusion and emitter diffusion to complete the N paths to produce the ultimate integrated circuit structure.

One particular feature to which attention is here drawn with reference to FIG. 6, is the vertical disposition of individual channels or posts 50, 52, 54 and 56, as grown upon the base layer 40. Thus, the potential of that base layer 40, as derived from the voltage source 58 through metal heat sink 70, is supplied to the top surface lands 60, 62, 64 and 66 at the top ends of the respective posts. Metal heat sink 70 may be composed of any suitable conductive metal, one example of which is gold plated molybdenum with the chip bonded thereto by conventional gold silicon eutectic means. Those lands are separately available for connection to suitable electrode terminal resistors for further connection to other areas or lands at the top layer level for the circuitry desired. Consequently, there is no mutual circuit between the posts as part of the wafer, that would cause voltage drop in one circuit to affect a cooperating circuit. The full voltage from the base layer to each land is available irrespective of the operation of the other circuits including one of the other posts, and a circuit energized therefrom will have its full voltage under all operating conditions.

Another important feature of this invention is that the use of the entire base layer as a voltage supply permits the bottom surface to be rested on a metal heat sink 70 to hold the wafer operating temperature down. The heat sink 70 is grounded and such ground plane at the base of the chip provides a stabilizing environment for alternating current operations within the wafer.

In passing, brief reference may be made to some details of operation of the conventional circuit of FIG. 1, to emphasize the importance of the features of this invention which enables a transistor to have its full "up" voltage by the elimination of the voltage drop in a mutual resistance path in the voltage supply circuit. Separate resistors R–1 and R–3 go to the power supply from the collector terminals of transistors T–1 and T–3. The reference voltage is arranged so transistor T–3 will go on if I–1 and I–2 are down. If either I–1 or I–2 then goes on, transistor T–3 will go off. Thus, current will flow through R–1 or R–3, but never through both simultaneously. The collector node approaches positive power supply voltage when the resistor is not drawing current. On the collector node of the other transistor where the resistor is drawing current, the voltage at the node will go "down." It is important, therefore, that the voltage to any node shall not be affected by a drop in a path mutual even in part to another transistor circuit.

By means of the separation of voltage paths taught herein for a small wafer or chip, the disadvantage of the mutual effect and voltage loss is avoided.

Further, any inherent intrinsic resistance of each path from the base layers to an electrode land, may be utilized as part of the resistance to the node or electrode of any transistor.

Thus, as in FIG. 4, an internal post 22, having its intrinsic resistance and the separate resistor 24, which may be formed within the semiconductor wafer by diffusion or ion implantation techniques, constitute the voltage supply resistance from the substrate 14 to the terminal area of the transistor, here the collector electrode in this example, to establish a switching circuit in the combination of the several other components to be combined in an arrangement such as in FIG. 1, for example.

While the invention has been particularly shown and described with reference to a preferred embodiment thereof, it will be understood by those skilled in the art that various changes in form and details may be made therein without departing from the spirit and scope of the invention.

The word wafer, as used throughout the description, is intended to include also the concept of a chip as a subdivision of a wafer.

It is also contemplated that additional layers of active semiconductor material will be superposed on the layers illustrated, as may be necessary to form specific semiconductor devices such as transistors and resistors that may be desired. The present description serves to illustrate the invention of providing the independent voltage connections unaffected by mutual circuit conditions.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A monolithic integrated circuit device comprising:

a back surface layer of a first conductivity type of semiconductor material, to serve as a heat-transfer and cooling layer for the chip, and to serve also as a bus terminal for circuits to be constructed in said device;

a first layer of semiconductor material thereover of a second conductivity type;

a second layer of semiconductor material over the said first layer of the first conductivity having a first conductivity type;

transistors formed at least in part in the top surface of said second layer;

channels of semiconductive material of the first conductivity type formed respectively as discrete continuations from said back layer extending to the top surface of said second layer to provide areas of fixed potential at said top surface;

isolation regions of the second conductivity type in said second layer extending from said top surface to said first layer surrounding said channels and isolating said channels from said transistors;

and output electrodes connected to said channels at said top surface areas.

2. The monolithic device as claimed in claim 1, in which the said back surface layer is conditioned to be connected to a supply source of voltage for said output electrodes when connected to an external energizing circuit.

3. The monolithic device as claimed in claim 2, in which said back surface layer is conditioned to constitute a layer of semiconductor material of the type related to the polarity of the potential adapted to be applied to said output electrodes.

4. The monolithic device as in claim 3, in which each of said discrete continuations constitutes an extension of said back surface layer of semiconductor material and is of corresponding type.

5. The monolithic device as claimed in claim 1, in which voltage supply means are provided to bias said back surface layer and said second layer respectively in backward directions.

6. The monolithic device of claim 1 wherein said integrated circuit device include current switch emitter follower circuits, and said channels constituting a resistance in the voltage supply path of each of said current switch emitter follower circuits.

7. The monolithic device of claim 6 wherein each of said current switch emitter follower circuits also including a separate diffused resistor in its voltage supply path whereby parasitic resistance is avoided with its resultant voltage loss.

* * * * *